United States Patent [19]

King

[11] Patent Number: 5,014,071
[45] Date of Patent: May 7, 1991

[54] FERRITE ROD ANTENNA

[75] Inventor: Jeffrey S. King, Boynton Beach, Fla.

[73] Assignee: Motorola, Inc., Schaumburg, Ill.

[21] Appl. No.: 374,012

[22] Filed: Jun. 30, 1989

[51] Int. Cl.$^5$ .................. H01Q 7/080; H01Q 7/000; H05K 7/020; H01R 9/000
[52] U.S. Cl. ..................... 343/788; 343/742; 343/870; 343/878; 361/400; 361/405; 361/417; 361/420
[58] Field of Search ............ 343/787, 788, 857, 858, 343/866, 867, 870, 878, 741, 742, 895, 896; 336/208, 225, 199, 200, 65, 82, 205; 361/400, 417, 408, 404-406, 419, 420

[56] References Cited

U.S. PATENT DOCUMENTS

| | | | |
|---|---|---|---|
| 2,653,992 | 9/1953 | Hill | 174/138 |
| 3,267,478 | 8/1966 | Schiefer | 343/788 |
| 3,403,298 | 9/1968 | Richards et al. | 317/99 |
| 3,594,805 | 7/1971 | Chardin | 343/746 |
| 3,649,939 | 3/1972 | Hildebrandt | 336/65 |
| 3,823,403 | 7/1974 | Walter et al. | 343/708 |
| 3,946,397 | 3/1976 | Irwin | 343/788 |
| 4,270,128 | 5/1981 | Drewett | 343/702 |
| 4,334,228 | 6/1982 | Johns | 343/722 |
| 4,795,991 | 1/1989 | Saito | 333/181 |
| 4,814,782 | 3/1989 | Chai | 343/787 |
| 4,866,573 | 9/1989 | Bernstein | 361/400 |

FOREIGN PATENT DOCUMENTS 0154245 12/1979 Japan .................. 343/788

Primary Examiner—Michael C. Wimer
Assistant Examiner—Peter Toby Brown
Attorney, Agent, or Firm—William E. Koch; Vincent B. Ingrassia

[57] ABSTRACT

An antenna for coupling to a printed circuit board comprises a ferrite rod and an electrically conductive coil having at least one turn extending around the core. The ends of the coil form the antenna's leads and are bent to retain the core therebetween. The coil is also bent to form a protrusion which extends away from the core. The antenna's leads and the protrusion may then be coupled to a printed circuit board to secure the antenna.

2 Claims, 1 Drawing Sheet

FERRITE ROD ANTENNA

BACKGROUND OF THE INVENTION

This invention relates generally to a ferrite rod antenna. More particularly, the present invention relates to a ferrite rod antenna wherein a single piece of wire forms both the antenna coil and a retention means for the antenna assembly.

Antenna elements have been down sized in order to meet the manufacturing and size constraints which accompany the trend towards smaller paging and radio receiver packages. Such antennas, however, must nevertheless provide a sufficiently high (Q) while simultaneously exhibiting sufficient radiated signal sensitivity.

U.S. Pat. No. 3,267,478, issued Aug. 16, 1966 describes an antenna which comprises a cylindrical core surrounded by a sleeve of electrically conductive material. A gap runs the entire length of the sleeve and has a plurality of capacitors distributed throughout its length. A coupling winding surrounds at least a portion of the core and includes a pair of wires for coupling the antenna assembly to the receiver. Unfortunately, the antenna provides no means for readily mounting the antenna assembly to a printed circuit board. Thus, this antenna system would not be suitable for use in conjunction with todays more complex mounting and circuit interconnection techniques.

Similarly, U.S. Pat. No. 3,594,805, issued Jul. 20, 1971 describes an antenna in which the resonant frequency may be adjusted by varying the inductance of a first split sleeve. The opposite edges of the longitudinal split are connected by a plurality of capacitors uniformly distributed over the length of the sleeve. The first sleeve additionally includes a longitudinal slot approximately one third the length of the rod. A second split sleeve is positioned over the first sleeve to adjust the inductance of the assembly by masking poritons of the longitudinal slot. As was the case before, no adequate means are disclosed for mounting the antenna assembly to a printed circuit board. Furthermore, wire leads are necessary for forming the electrical connections between the circuit and the antenna.

U.S. Pat. No. 3,946,397, issued Mar. 23, 1976 discloses an antenna arrangement which includes a spiral inductor or coil which is divided into a number of segments interconnected by individual capacitor elements to form a number of series resonant circuits. While an effective antenna technique, this arrangement still does not describe a simple mechanism for implementation and connection to a printed circuit board.

In an effort to overcome the above described disadvantages, U.S. Pat. No. 4,814,782, issued Mar. 21, 1989 discloses an antenna which includes a generally elongate, magnetically permeable core having a major axis and an insulating substrate affixed along an axis parallel to the major axis. The insulating substrate has a plurality of opposed pairs of conductive runners positioned at generally regular intervals along the substrate normal to the major axis. A plurality of discrete capacitors are secured between opposite pairs of conductive runners. An electrically conductive split sleeve substantially surrounds the core and has pairs of opposed tabs on the edge portions in electrical connection with the opposed pairs of conductive runners. The sleeve further includes integral mounting tabs for securing the antenna assembly to the printed circuit board to establish electrical connection to the antenna without the use of wire leads.

Unfortunately, the system described in this latter patent involves an assembly process which is both complex and costly. For example, the capacitors are attached to the printed circuit board by a reflow process, and the sleeve is hand soldered. The ferrite core or rod must be aligned in the sleeve and then glued thereto. The ferrite core is also glued to the printed circuit board.

In a low band version of this antenna assembly, a copper strip is wrapped around the ferrite core (i.e. 5 turns). The strip is aligned, and the assembly is then subjected to a shrink wrap process. The shrink wrap is then cut to expose the leads, the assembly is glued to the printed circuit board, and the leads are soldered.

These processes are complex, time consuming, and result in an arrangement which is easily damaged during normal use. It would therefore be highly desirable to provide a ferrite rod antenna assembly which can be easily mounted and electrically connected to a printed circuit board.

SUMMARY OF THE INVENTION

It is an object of the present invention to provide an approved ferrite rod antenna structure.

It is a further object to the present invention to provide a ferrite rod antenna assembly which may be easily mounted on a printed circuit board.

It is still a further object to the present invention to provide a ferrite rod antenna assembly which is simple and self fixturing.

According to a broad aspect of the invention there is provided an antenna for coupling to a printed circuit board, the antenna comprising of a ferrite rod and an electrically conductive coil having at least one turn extending around the core. The ends of the coil form the antennas leads and are bent to retain the core therebetween. The coil is also bent to form one or more protrusions which extends away from the core. The antenna's leads and the protrusions may be fixably coupled to a printed circuit board to secure the antenna.

The above and other objects, features and advantages of the present invention will be more clearly understood from the following detailed description taken in conjunction with the accompanying drawings, in which:

DESCRIPTION OF THE PREFERRED EMBODIMENT

Figure 1:
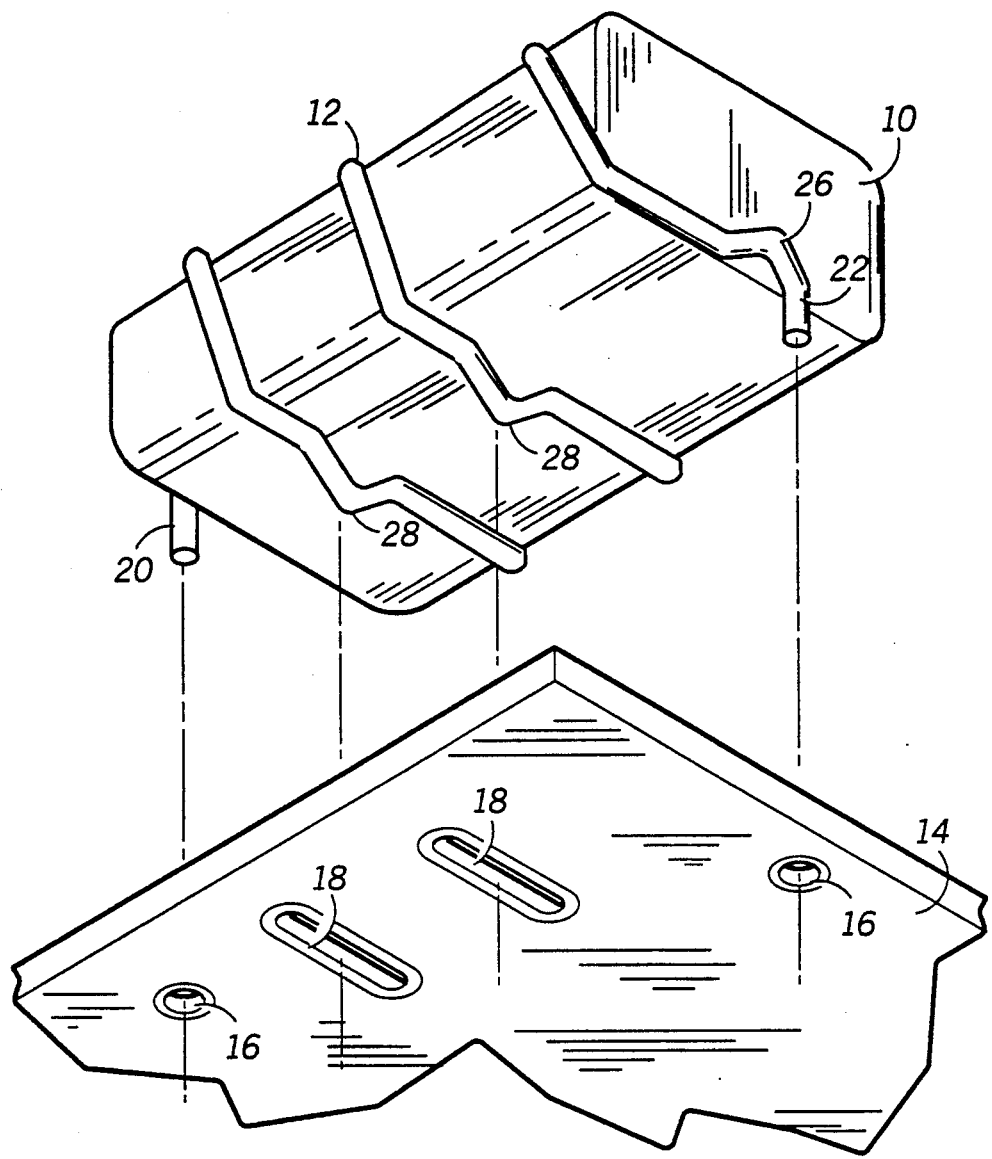
FIG. 1 is an exploded view of a ferrite rod antenna in accordance with the present invention and illustrates how the antenna can be coupled to a printed circuit board.
Figure 2:
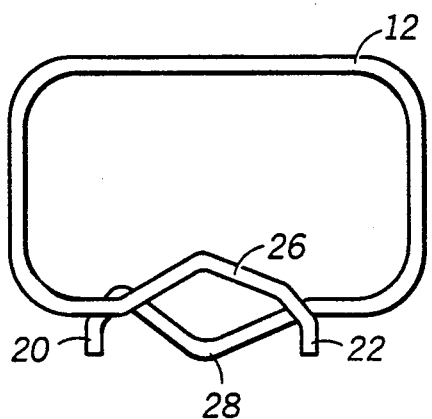
FIG. 2 is an end view of the coil utilized in the antenna assembly shown in FIG. 1.
Figure 3:
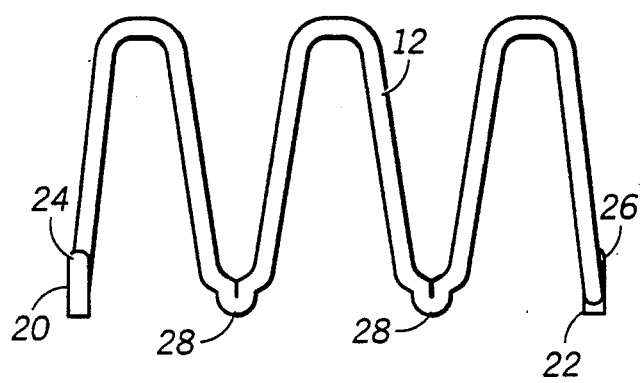
FIG. 3 is a side view of the coil utilized in the antenna assembly shown in FIG. 1.

Referring to FIG. 1, the inventive antenna assembly comprises a core 10 of magnetically permeable material (a ferrite rod) which is positioned within the turns of an electrically conductive coil 12 (shown in more detail in FIGS. 2 and 3). Also shown in FIG. 1 is a printed circuit board 14 having a plurality of circular plated holes 16 and elongate plated holes 18 therethrough. These holes are produced in accordance with well known printed circuit board techniques.

Referring again to FIGS. 1, 2, and 3, coil 12 has first and second ends 20 and 22 which form the antenna's leads. These leads each have a portion 24 and 26 respectively which is bent upward so as to reside adjacent the ends of core 10. In this manner, core 10 is retained within coil 12 and between leads 20 and 22. Additionally, lower portions of coil 12 are bent to form protrusions 28 which extend away from core 10. These protrusions 28 may be inserted into apertures 18 and the ends of leads 20 and 22 may be inserted into apertures 16 in the printed circuit board. Next, using any one of a number of known techniques (e.g. soldering, reflow, etc.) leads 20 and 22 and protrusions 28 can be fixedly coupled to the printed circuit board. As a result, bent portions 24 and 26 on the coil retain core 10 in position while the interaction of apertures 16 and 18 with leads 20 and 22 and protrusions 28 fixed the position of the coil on the printed circuit board.

Thus, there has been described an antenna system for coupling to a printed circuit board which requires only two components, a ferrite core and a single piece of wire which may be pre-formed to a desired configuration. The wire serves as a multi-functional piece part and replaces many of the previously needed components. The coil completely retains the core in all directions thus substantially reducing the possibility of disassembly if the device is subjected to shock or vibration.

Coil 12 is positioned on the printed circuit board by apertures 16 and 18 which determine the exact spacing of the loops. After the antenna assembly has been positioned on the printed circuit board, no hand soldering is required. The part can be easily reflowed with core 10 in place.

To summarize, many piece parts previously required by prior art devices have been eliminated. Likewise, steps such as gluing, heating to shrink tubing, hand soldering, have likewise been eliminated. Coil to coil registration is more accurately maintained by the slots 18 in the printed circuit board. The inventive antenna assembly is sturdier, represents a significant cost reduction, and results in a significant cycle time reduction.

The above description is given by way of example only. Changes in form and details may be made by one skilled in the art without departing from the scope of the invention as define by the appended claims.

What I claim is:

1. An antenna having provision for mounting to a printed circuit board having receiving apertures therein, said antenna comprising:
   a core;
   an electrically conductive coil having at least one turn extending around said core and having first and second end portions for retaining said core between said first and second end portions, said first and second end portions forming leads for insertion into first and second ones of said receiving apertures, said at least one turn having a portion which is bent to form a protrusion away from said core for insertion into a third one of said receiving apertures.

2. An antenna according to claim 1 wherein said core has a longitudinal axis and first and second end surfaces and wherein said first and second end portions of said coil reside adjacent said first and second end surfaces respectively.

* * * * *